United States Patent [19]

Howell et al.

[11] 4,427,114

[45] Jan. 24, 1984

[54] PROTECTIVE PACKAGING CONTAINER FOR ELECTROSTATIC DISCHARGE SENSITIVE DEVICES

[75] Inventors: George L. Howell; Gregg F. Lambrix, both of Elmira, N.Y.

[73] Assignee: F. M. Howell & Company, Elmira, N.Y.

[21] Appl. No.: 492,782

[22] Filed: May 9, 1983

[51] Int. Cl.$^3$ .................. B65D 73/02; B65D 85/42
[52] U.S. Cl. .................................. 206/328; 206/334; 206/454; 361/220; 361/212
[58] Field of Search ............... 206/328, 334, 454; 428/522, 215; 361/220, 212

[56] References Cited

U.S. PATENT DOCUMENTS

| | | | |
|---|---|---|---|
| T927,008 | 10/1974 | Sherman et al. | 206/454 |
| 4,154,344 | 5/1979 | Yenni, Jr. et al. | 206/328 |
| 4,211,324 | 7/1980 | Ohlbach | 206/328 |
| 4,238,030 | 12/1980 | Maylandt | 206/328 |
| 4,293,070 | 10/1981 | Ohlbach | 206/328 |

*Primary Examiner*—Joseph Man-Fu Moy
*Attorney, Agent, or Firm*—Mason, Fenwick & Lawrence

[57] ABSTRACT

A box-like package or container for electrostatic discharge susceptible devices such as contained on printed circuit boards or the like, wherein the container is formed of electrically surface and volume conductive paperboard or clipboard having surface resistance in the range of about $10^3$–$10^9$ ohms per square, forming a rapid box, overwrapped with electrically surface and volume conductive paper having surface resistance in the range of about $10^3$–$10^5$ ohms per square, and provided with a thermoformed plastic insert filler formed of anti-static plastic material providing parallel ribs arranged in vertical planes and defining grooves or slots for receiving and positioning the edges of the printed circuit boards or planiform ESD susceptible devices to be packaged therein. The resistance properties along the exterior of the container and the parallel resistance effect of the conductive paper and conductive paperboard are such that during charge redistribution when a highly charged object approaches near the container, the path of least resistance is around the walls of the container and not through the ESD susceptible devices packaged therein.

15 Claims, 6 Drawing Figures

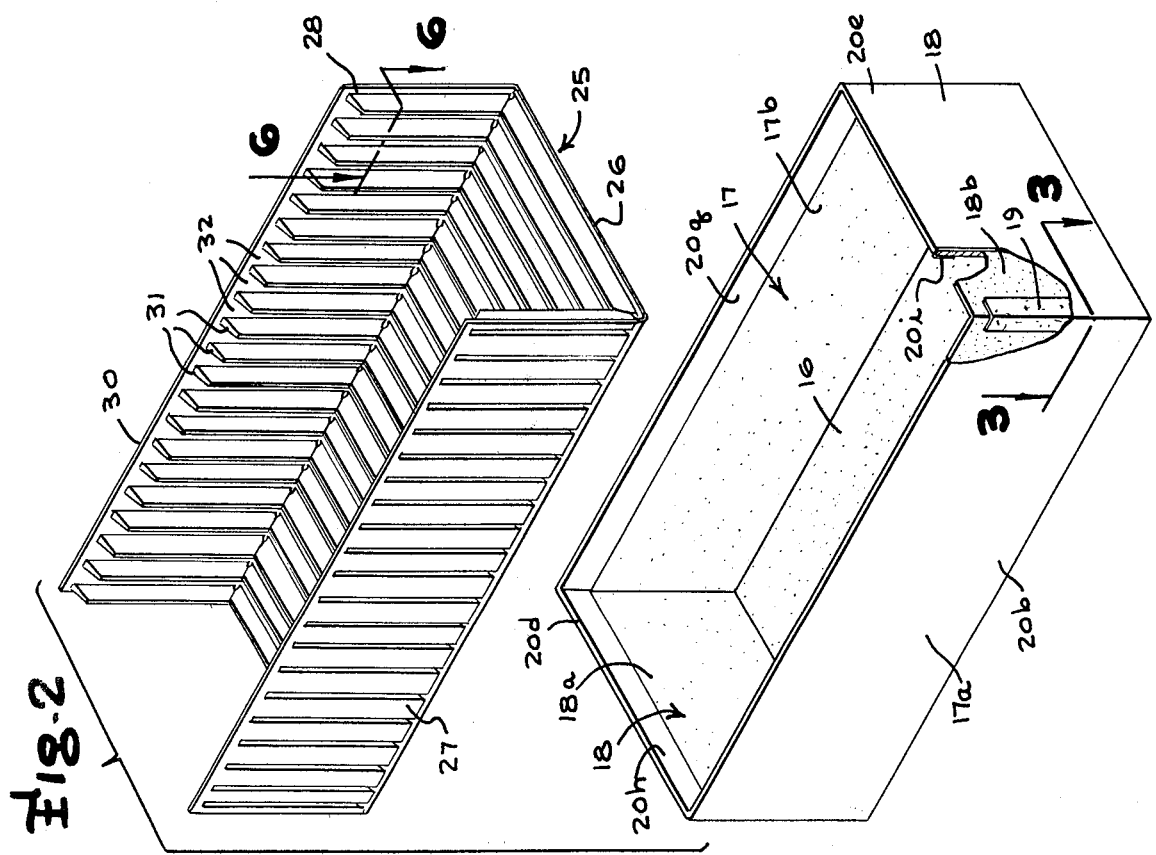
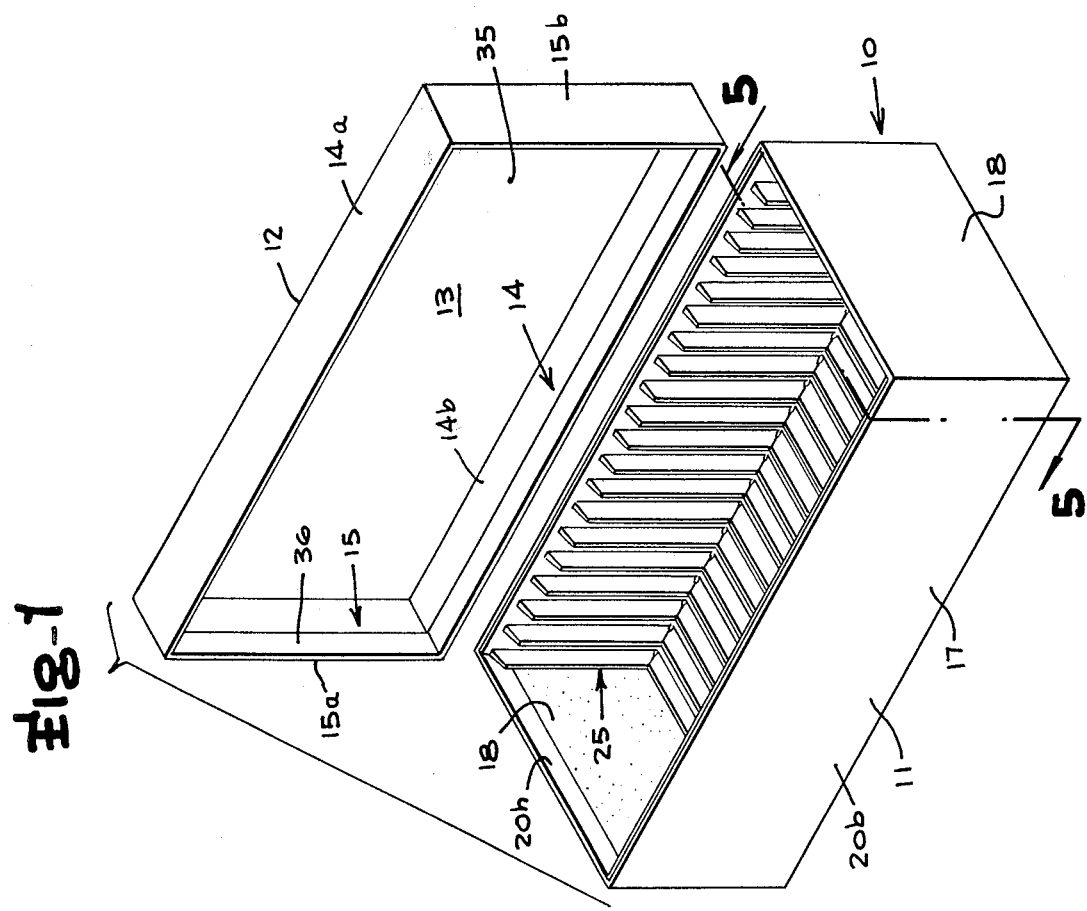

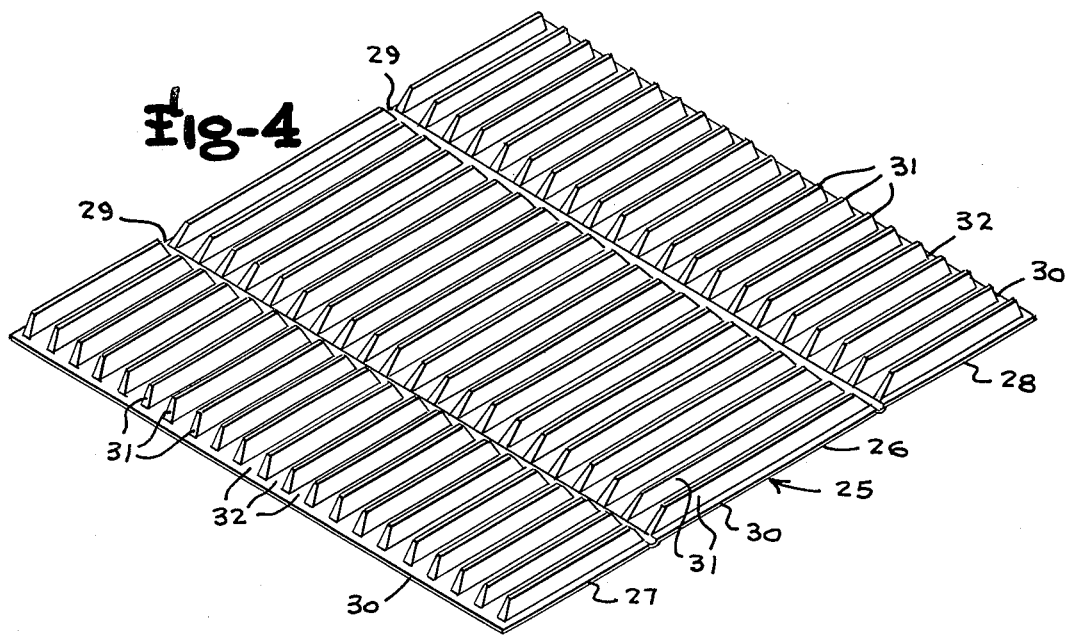
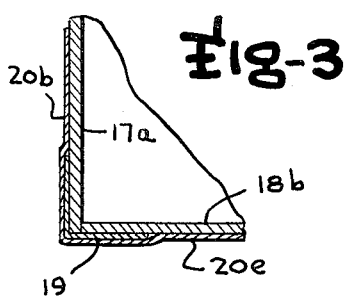
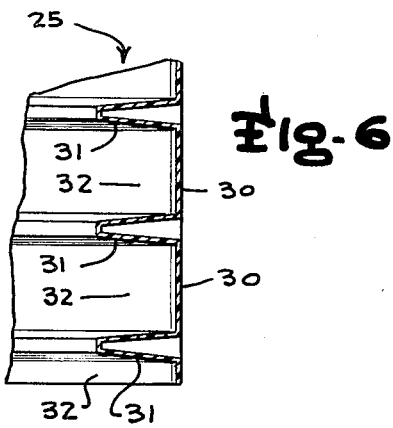
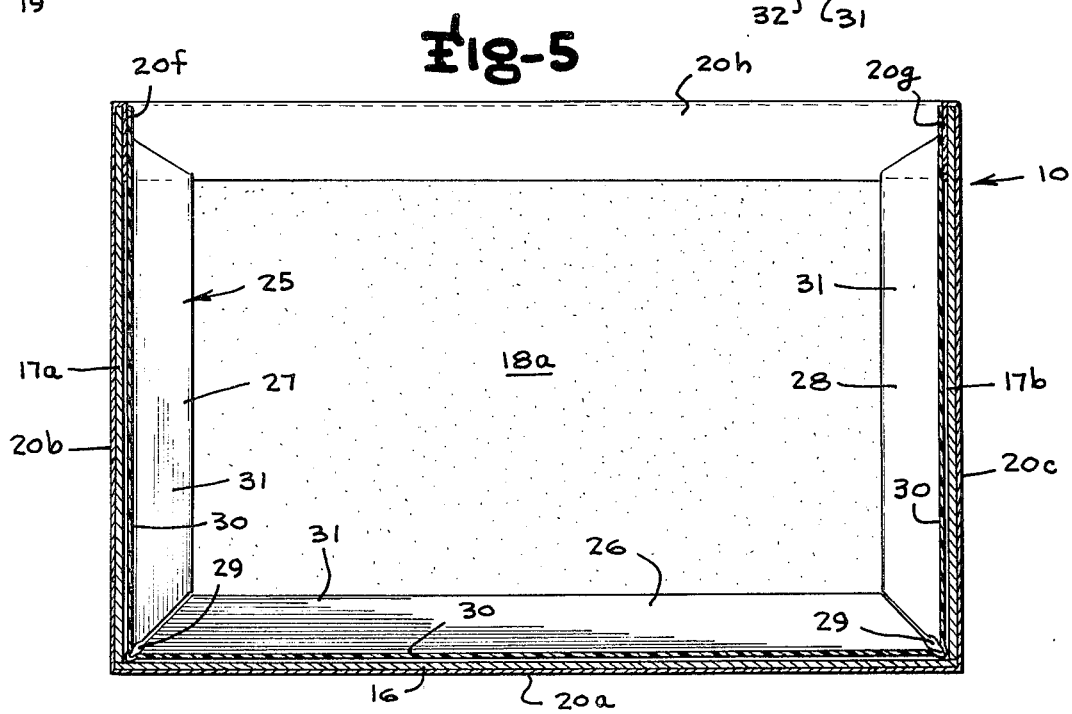

PROTECTIVE PACKAGING CONTAINER FOR ELECTROSTATIC DISCHARGE SENSITIVE DEVICES

BACKGROUND AND OBJECTS OF THE INVENTION

The present invention relates in general to protective containers or packaging for handling, shipping, and/or storing rigid generally planiform devices subject to damage by static electricity discharges, and more particularly to static electricity discharge protective containers or packaging for printed circuit boards, solid state semiconductor devices and chips of generally panel or planiform shaped configuration and similar devices subject to possible damage through discharge of static electricity, having means for guiding and positioning the printed circuit boards or like electrostatic discharge susceptible (ESDS) devices in like oriented parallel vertical planes or similar predetermined orientation.

Static electricity and protection against electrostatic discharges (ESD) is becoming more and more recognized as a significant problem in the handling, shipping, and storing of ESDS electronic parts or printed circuit boards which contain ESDS electronic parts; such electronic parts, for example, as any electronic part incorporating: accessible metal oxide semiconductor structures, small cross-sectional area semiconductor junctions, low power film resistors, long thin metalization strips, piezoelectric crystals, and closely spaced electrode structures, hereinafter frequently referred to as ESDS devices. Packaging of such devices for shipping, transferring from one location to another, and storing at production and service lines present significant problems in protecting such devices against static electricity discharges which might cause damage to the devices or to circuit components incorporated in them.

Previous to May, 1980 industry had no standard yardstick to measure device susceptibility levels. Since that time, military standard DOD-STD-1686 has provided such a yardstick in establishing classification levels of susceptibility. Three classes have been identified: class 1 includes those devices most susceptible and which fail when subjected to 1000 v from a human body equivalent circuit of 100 pf and 1500 ohms; class 2 includes devices which are not damaged by 1000 v but are damaged by 4000 v from the same human body equivalent circuit mentioned above sufficiently to be out of specification tolerance; class 3 includes devices which are not damaged by 4000 v but are damaged by 15,000 v sufficiently to be out of specification tolerance. With this classification system and the growing awareness of ESD, some protective packaging has been found inadequate to protect the most susceptible devices in the class 1 susceptibility classification.

A number of approaches have been tried to provide the desired protection of such devices against electrostatic discharge (ESD) events. In the early 1970's the electrically conductive black carbon-impregnated polyolefin plastic bags, and the high surface resistance, but groundaable pink, antistatic chemical-impregnated polyethylene bags were practically the only ESD protective packaging in use. When new multi-laminate metal coated bags became available, data was forthcoming showing how both the pink antistatic polyethylene bag and the conductive black polyolefin bags did not prevent the most susceptible parts such as the 3N157 from being damaged. The reason for this is their surface resistance is so high that potential difference develops across the bag which will cause an electric field to exist in the bag long enough to cause failure. Thus, for ESD protective bags to provide adequate shielding, sufficiently low surface resistance is necessary to protect the most susceptible class 1 devices.

What has not become widely apparent to the the related trade is that ESD protective packaging just being electrically conductive is not enough. For example, damaging conditions can occur in an arrangement such as disclosed in Cohen U.S. Pat. No. 4,308,953 involving a box-like container having electrically nonconductive cardboard walls provided with electrically conductive material (coated) on the opposite sides thereof and electrically conductive holding panels defining slots or grooves for guiding and locating the edges of the planiform printed circuit boards or ESD sensitive devices. As a person is charged walking on an electrostatic generating (ESG) surface, such as a nylon carpet, holding such a conductive container the container will build up a charge which will lie on the outside surface of the container, thus storing electrostatic energy on the container. If one side of this charged-up container is touched against a grounded metal surface, the side touching the metal surface will go instantly to ground but the opposite side will still be at the previous potential. If this surface conductive container is retaining rigidly between the two sides ESDS printed circuit cards with class 1 devices such that a moderately low resistance path exists from the edges of the printed circuit board to the exterior surfaces and if the outer surface conductivity is not high enough, a transient electric field will pass through the printed circuit board, which can damage the class 1 ESDS devices on the board, especially those that are voltage susceptible as opposed to those that are energy susceptible.

Another proposed solution was to provide a container in generally box form made of conductive plastic material so that the entire container was conductive. Conventionally, such a container was molded entirely from plastic material and provided with formations to receive the static sensitive devices. Such molded plastic containers were expensive to manufacture and also did not eliminate the possibility of the devices picking up static charges.

Other proposed arrangements have included cardboard containers provided on the interior walls with anti-static plastic members, wherein the cardboard container was not electrically conductive, and the anti-static plastic members in direct contact with the ESD susceptible devices, which also were not always electrically conductive, failed to provide the desired protection against unwanted static buildup. Still another arrangement involved cardboard shipping containers or boxes provided with an electrically conductive coating sprayed on the interior of the box, some of which additionally included multiple partitioning arrangements for receiving the ESD devices, but these did not ensure suitable protection of the devices and charge bleed off when placed on a grounded surface. Examples of these prior art approaches are found in Ohlbach U.S. Pat. Nos. 4,160,503; 4,211,324; and 4,293,070.

Study has revealed that the requirements the ESD protective containers must satisfy is to contain the ESD susceptible device or printed circuit board in such a way to permit the exposure of such devices to high fields and induced charge separation when they are out of the ESD protected work area where they are packaged or unpackaged, without any possible electrostatic discharge harm to the ESD susceptible devices inside the container, and to also enable the container to be brought into an ESD protected work area by having all parts of the container groundable so that no surfaces will retain charge which could induce charge on objects or devices in the container which ultimately would lead to an ESD event.

The containers disclosed in the above-identified Ohlbach patents do not achieve these design criteria, because the exterior surfaces will not sufficiently bleed-off a charge accumulated on the conductive interior surface as may occur over a period of time in a charge environment. When the properly grounded operator handles the container by touching only the non-conductive exterior, the charge on the conductive surface is deliverable with a high probability of being a damaging ESD event if the ESDS device or circuit board is touched before interior surfaces. There is even a possibility of a damaging electrostatic discharge from the charge redistribution process even if the interior conductive surface of the container is touched first by the grounded operator.

An object of the present invention, therefore, is the provision of a novel box-like package or container for electrostatic discharge susceptible devices such as contained on printed circuit boards or the like, wherein the container is formed of electrically surface and volume conductive paperboard or chipboard forming a rigid box, overwrapped with electrically surface and volume conductive paper, and provided with a thermoformed plastic insert filler formed of anti-static plastic material providing parallel ribs arranged in vertical planes spaced equidistant from each other defining grooves or slots for receiving and positioning the edges of the printed circuit boards or planiform ESD susceptible devices to be packaged therein, providing improved protection for the ESD susceptible devices to be packaged against undesired damaging static discharge events.

Another object of the present invention is the provision of an electrostatic discharge protective container or package as described in the immediately preceding paragraph, which incorporates sufficient resistance properties at all points along the exterior surfaces of the container due to the beneficial effect of parallel resistance of the conductive paper and conductive paperboard to the interior ESD susceptible devices so that during charge redistribution when a highly charged object approaches near the container, the path of least resistance is around the walls of the container and not through the ESD susceptible devices packaged therein due to the volume resistance of the conductive paperboard which dissipates significant potential differences and the anti-static insert filler which will also dissipate potential differences, and wherein all parts of the container are groundable such that charge bleed-off is ensured when the container rests on a properly grounded surface.

Other objects, advantages, and capabilities of the present invention will become apparent from the following detailed description, taken in conjunction wiht the accompanying drawings illustrating a preferred embodiment of the invention.

BRIEF DESCRIPTION OF THE FIGURES

FIG. 1 is an exploded perspective view of an ESD protective packaging container embodying the present invention;

FIG. 2 is an exploded perspective view of the lower or tray portion of the container with parts of one corner broken away or sectioned;

FIG. 3 is a fragmentary horizontal section view through a corner of the tray section of the container taken along line 3—3 of FIG. 2;

FIG. 4 is perspective view of the anti-static slot-forming molded insert shown with the three sections aligned in unfolded condition as initially made;

FIG. 5 is a vertical transverse section view taken along the line 5—5 of FIG. 1; and FIG. 6 is a vertical fragmentary section view taken along line 6—6 of FIG. 2.

DETAILED DESCRIPTION OF A PREFERRED EMBODIMENT

Referring to the drawings, wherein like reference characters designate corresponding parts throughout the several figures, the ESD packaging container of the present invention, indicated generally by the reference character 10 basically comprises a lower or tray container section 11 and a cover member 12 sized and shaped to interfit downwardly over the upper portion of the lower companion container section 11. The cover member 12 includes a top panel 13 of rectangular configuration and downwardly extending depending lips or flanges 14a, 14b at the sides thereof and 15a, 15b at the ends thereof extending perpendicularly downwardly from the plane of the top panel 13 and sized to receive and outwardly abut the vertical side and end walls of the lower container section 11. Lower container section 11 includes a bottom panel 16 having a pair of parallel vertically upwardly extending side wall panels 17a, 17b and parallel vertical upwardly extending end wall panels 18a, 18b integral with the bottom panel 16 and forming an upwardly opening rectangular well or enclosure for the ESD susceptible devices to be packaged.

The bottom side and end panels 16, 17a, 17b and 18a, 18b are formed of a boxboard blank of electrically surface and volume conductive paperboard or box blank inner or core material of the type generally referred to in the trade as chipboard, cardboard, kraftboard or the like (hereinafter referred to by the generic term "paperboard") for example having a caliper of about 54 mils, processed so that the electrical resistance characteristics of the inner paperboard core of boxboard blank is either an electrically "conductive" material whose electrical surface resistance falls in the range below $10^5$ ohms per square (normally within the range of about $10^3$–$10^5$ ohms per square), or a material termed "static dissipative" whose electrical surface resistance is in the range of $10^5$ to $10^9$ ohms per square, all as identified in the DOD Handbook 263 and as generally accepted as definitions for those terms in the related industry. The chosen material should have volume resistance low enough to substantially aboid capacitive coupling effects and high enough to dissipate the fields relative to the surface resistivity, for example a volume resistance of about $10^4$ ohms-cm. The electrically conductive or electrically static rigid paperboard core forming the bottom, side wall and end wall panels of the lower or tray container 11, indicated by the reference characters 16, 17, and 18, are folded into box form and the adjacent vertical edge portions of the panels 17a, 17b, and 18a, 18b are taped, as indicated at 19. These paperboard panels 16–18 are then all overwrapped with surface and volume conductive paper 20, individual panels or sections of which are indicated at 20a–20e, overlying the paperboard core or boxboard blank panels 16, 17, and 18, for example box overwrap conductive paper having a caliper of about 7 mils, and an electrically conductive surface having electrical surface resistance lying within the range previously identified of $10^3$–$10^9$ ohms per square. Extension flaps of the overwrap paper material indicated at 20f–20i at the tops of side and end wall panel portions 20b–20e of the paper overwrap extend over the top edge of the associated paperboard core of boxboard blank panel portions 17 and 18 and are secured against the upper inner surfaces of these panel portions. The overwrap conductive paper 20 is adhesively secured to the confronting surfaces of the paperboard blank panels 19b–19e by conventional adhesives of the type commonly used in the paperboard packaging industry.

An insert filler member, indicated by reference character 25 is especially shaped and formed to nest against the inwardly facing vertical side and end walls and upwardly facing bottom wall of the lower container section 11 in close abutment with such surfaces, and in the preferred and illustrated embodiment, is a thermoformed plastic insert filler such as thermoformable antistatic polyethylene having electrical surface conductive or surface resistance characteristics (typically $10^{12}$ ohms per square) such as to constitute it an "anti-static" plastic material as that term is recognized in the above-referred to DOD Handbook 263 and understood in the trade, having electrical resistance in the range $10^9$ to $10^{14}$ ohms per square. The insert filler member is a unitary one-piece structure formed in three sections as illustrated, providing a bottom section 26 and side sections 27 and 28, with the side sections hinged along integral hinge scores 29 transversely spanning the elongated filler member in its flat or unfolded condition so that they can be erected to perpendicular upwardly extending positions relative to the bottom web or base wall portion 30 of the plastic thermoformed insert. As is clearly visible from the drawings, each of the bottom and side sections 26, 27, and 28 of the plastic thermoformed insert include a plurality of upwardly projecting (or inwardly projecting from the sides when the sides are erected to perpendicular relation with the bottom section) elongated narrow rib formations 31 spaced transversely from each other and extending in vertical planes perpendicular to the plane of the bottom web or base wall portion 30 appropriate distances to define grooves or slots 32 therebetween of appropriate width to correspond closely to and tightly receive the adjacent edge portions of the bottom edge and the two opposite vertical side edges of the generally planiform ESD susceptible device or printed circuit board in properly positioned relation in the grooves.

The top or cover member 12 of the container, in a manner similar to the lower container section, is also formed of an inner paperboard or boxboard blank core 35 having the same electrical surface and volume resistance range as the paperboard core of the lower container section 11, shaped, scored and folded to form the top panel 13 side lips or flanges 14 and end lips or flanges 15, all of which are covered by conductive overwrap paper 36 having the same surface and volume electrical resistance characteristic as the overwrap paper 20, similarly formed to appropriately cover the outer surfaces of the cover member 12 as well as lap inwardly under the lower edges of the side and end flanges 14, 15.

We claim:
1. A protective box-like container for protecting electrostatic discharge sensitive devices of generally planiform configuration from damage by electrostatic discharge events, comprising a lower box-shaped container section and a top cover section shaped to interfit thereon as a top closure, the lower box-shaped container section comprising an inner boxboard blank core of elctrically surface and volume conductive paperboard material, shaped and erected to define a bottom panel and upright side wall panels and end wall panels adjoining the side wall panels defining corners of the box section, the outer surfaces of said bottom, side wall and end wall panels being covered throughout by an electrical surface and volume conductive paper overwrap throughout the exterior surface thereof having electrical surface resistance in the range of about $10^3$ to $10^5$ ohms per square, the paperboard material forming the inner paperboard core having electrical surface and volume conductivity properties such that the electrical surface resistance thereof lies in the "conductive" or "static" dissipative electrical resistance ranges of about $10^3$ to $10^9$ ohms per square and its volume resistance being low enough to substantially avoid capacitive coupling effects and high enough to dissipate fields, and an anti-static plastic insert filler shaped to lie in closely abutting relation against inwardly facing surfaces of the bottom and upright side wall panels of said box blank member, the insert filler having formations shaped to hold the electrostatic discharge susceptible devices in predetermined position and the plastic material of said insert filler being an anti-static plastic having electrical surface resistance in the range $10^9$ to $10^{14}$ ohms per square; the electrical resistance of said paperboard material being at a value intermediate between the electrical resistance values of said paper overwrap and said anti-static plastic; and said top cover section being formed of a paperboard core of material like the lower box section having a paper overwrap entirely covering the exterior surfaces thereof and electrically conductively contacting the paper wrap of the lower box section when in closed position thereon, the paperboard core and paper outer wrap of the cover section having similar electrical conductivity properties respectively to the paperboard core and paper overwrap portions of the lower box section, whereby during charge redistribution conditions of the container the path of least electrical resistance is around the walls of the container and not through the devices packaged therein and all parts of the container are groundable to ensure charge bleed-off when the container is in engagement with a grounded surface.

2. A protective container as defined in claim 1, wherein said anti-static plastic insert filler includes a bottom section co-extensive with the bottom panel of the lower container section and two flanking side sections extending in vertical upwardly projecting parallel relation perpendicular to the bottom section, each of said bottom and flanking side sections being formed with integral projecting ribs extending upwardly from the bottom section and inwardly from the side section to lie in parallel vertical planes paralleling the upright end wall panels of the box and defining parallel upwardly opening slots sized to receive the vertical edge portions of the electrostatic discharge susceptible devices therein.

3. A protective container as defined in claim 2, wherein said anti-static plastic insert filler is a one piece molded plastic filler formed with the bottom and two flanking side sections integrally hinged to each other along flexible hinge formations, whereby the side sections may be folded upwardly from the bottom section to lie in the parallel vertical planes against the end wall panels of the box.

4. A protective container as defined in claim 1, wherein said inner insert filler member is a thermoformed plastic member providing a thin base web portion between each of said formations lying in a common plane for each of the respective bottom and side sections of the insert filler member to be disposed in close contacting abutment with the inwardly facing surface of the adjacent bottom or side wall panel of the core blank member and the formations being integral centrally hollow ribs protruding inwardly from said base web portions defining with the latter the side and bottom walls respectively of inwardly and upwardly opening channels providing the slots for receiving the associated edges of the electrostatic discharge susceptible device to be positioned therein.

5. A protective container as defined in claim 2, wherein said inner insert filler member is a thermoformed plastic member providing a thin base web portion between each of said rib formations lying in a common plane for each of the respective bottom and side sections of the insert filler member to be disposed in close contacting abutment with the inwardly facing surface of the adjacent bottom or side wall panel of the core blank member and the rib formations being integral centrally hollow ribs protruding inwardly from said base web portions defining with the latter the side and bottom walls respectively of inwardly and upwardly opening channels providing the slots for receiving the associated edges of the electrostatic discharge susceptible device to be positioned therein.

6. A protective container as defined in claim 3, wherein said inner insert filler member is a thermoformed plastic member providing a thin base web portion between each of said rib formations lying in a common plane for each of the respective bottom and side sections of the insert filler member to be disposed in close contacting abutment with the inwardly facing surface of the adjacent bottom or side wall panel of the core blank member and the rib formations being integral centrally hollow ribs protruding inwardly from said base web portions defining with the latter the side and bottom walls respectively of inwardly and upwardly opening channels providing the slots for receiving the associated edges of the electrostatic discharge susceptible device to be positioned therein.

7. A protective container as defined in claim 1, wherein the material of said insert filler member is thermoformed anti-static polyethylene.

8. A protective container as defined in claim 2, wherein the material of said insert filler member is thermoformed anti-static polyethylene.

9. A protective container as defined in claim 3, wherein the material of said insert filler member is thermoformed anti-static polyethylene.

10. A protective container as defined in claim 1, wherein the electrically surface and volume conductive overwrap paper for the lower box section and the upper cover section each include flaps at the edges thereof folded into inwardly lapping and contacting relation with the respective associated edge portions of said side wall and end wall panels of the lower box section and the corresponding edge portions of the top cover section.

11. A protective container as defined in claim 2, wherein the electrically surface and volume conductive overwrap paper for the lower box section and the upper cover section each include flaps at the edges thereof folded into inwardly lapping and contacting relation with the respective associated edge portions of said side wall and end wall panels of the lower box section and the corresponding edge portions of the top cover section.

12. A protective container as defined in claim 3, wherein the electrically surface and volume conductive overwrap paper for the lower box section and the upper cover section each include flaps at the edges thereof folded into inwardly lapping and contacting relation with the respective associated edge portions of said side wall and end wall panels of the lower box section and the corresponding edge portions of the top cover section.

13. A protective container as defined in claim 4, wherein the electrically surface and volume conductive overwrap paper for the lower box section and the upper cover section each include flaps at the edges thereof folded into inwardly lapping and contacting relation with the respective associated edge portions of said side wall and end wall panels of the lower box section and the corresponding edge portions of the top cover section.

14. A protective container as defined in claim 5, wherein the electrically surface and volume conductive overwrap paper for the lower box section and the upper cover section each include flaps at the edges thereof folded into inwardly lapping and contacting relation with the respective associated edge portions of said side wall and end wall panels of the lower box section and the corresponding edge portions of the top cover section.

15. A protective container as defined in claim 6, wherein the electrically surface and volume conductive overwrap paper for the lower box section and the upper cover section each include flaps at the edges thereof folded into inwardly lapping and contacting relation with the respective associated edge portions of said side wall and end wall panels of the lower box section and the corresponding edge portions of the top cover section.

* * * * *